United States Patent
Hori et al.

(10) Patent No.: US 10,020,246 B2
(45) Date of Patent: Jul. 10, 2018

(54) SEMICONDUCTOR DEVICE

(71) Applicant: Mitsubishi Electric Corporation, Tokyo (JP)

(72) Inventors: Koichiro Hori, Tokyo (JP); Koichiro Nishizawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/345,560

(22) Filed: Nov. 8, 2016

(65) Prior Publication Data

US 2017/0229380 A1 Aug. 10, 2017

(30) Foreign Application Priority Data

Feb. 8, 2016 (JP) .................................. 2016-021641

(51) Int. Cl.
| | | |
|---|---|---|
| *H01L 23/48* | (2006.01) | |
| *H01L 21/306* | (2006.01) | |
| *H01L 21/3213* | (2006.01) | |
| *H01L 21/768* | (2006.01) | |

(52) U.S. Cl.
CPC ...... *H01L 23/481* (2013.01); *H01L 21/30604* (2013.01); *H01L 21/32134* (2013.01); *H01L 21/76898* (2013.01)

(58) Field of Classification Search
CPC ............. H01L 23/481; H01L 21/30604; H01L 21/32134; H01L 21/76898
See application file for complete search history.

(56) References Cited

U.S. PATENT DOCUMENTS

| | | | |
|---|---|---|---|
| 6,268,619 B1 * | 7/2001 | Kosaki | H01L 21/76838 257/276 |
| 2007/0181994 A1 * | 8/2007 | Fukase | H05K 1/116 257/700 |
| 2011/0195567 A1 | 8/2011 | Nishizawa | |
| 2012/0153476 A1 | 6/2012 | Shen | |

FOREIGN PATENT DOCUMENTS

JP    H10-303198 A    11/1998

OTHER PUBLICATIONS

An Office Action issued by Taiwan Patent Office on Sep. 22, 2017, which corresponds to Taiwanese Patent Application No. 105136224 and is related to U.S. Appl. No. 15/345,560.
An Office Action issued by Korean Patent Office dated Apr. 25, 2018, which corresponds to Korean Patent Application No. 10-2017-0009471 and is related to U.S. Appl. No. 15/345,560.

* cited by examiner

*Primary Examiner* — Long Pham
(74) *Attorney, Agent, or Firm* — Studebaker & Brackett PC

(57) ABSTRACT

A semiconductor device includes: a semiconductor substrate through which a via hole is formed from a back surface to a front surface of the semiconductor substrate; an electrode provided on the front surface of the semiconductor substrate and closing the via hole; and a metal film provided on the back surface of the semiconductor substrate, a side wall of the via hole and a lower surface of the electrode, wherein an opening is provided in the metal film on the back surface of the semiconductor substrate, and the opening abuts on only part of a circumference of the via hole.

3 Claims, 6 Drawing Sheets

SEMICONDUCTOR DEVICE

BACKGROUND OF THE INVENTION

Field

The present invention relates to a semiconductor device wherein a via hole is formed through the semiconductor substrate.

Background

In a case where electrical conduction is provided between a front surface of a substrate on which a semiconductor device is formed and a back surface opposite from the front surface, a via hole is provided in the semiconductor substrate to connect an electrode on the front surface side and a metal film on the back surface side through the via hole (see, for example, JP 10-303198 A).

When a semiconductor device of this conduction is manufactured, the electrode is first formed on the front surface of the semiconductor substrate. Subsequently, the semiconductor substrate is ground at the back surface side until the semiconductor substrate has a predetermined thickness. Subsequently, the back surface of the semiconductor substrate except the place for formation of the via hole is masked with a resist or the like and the semiconductor substrate is etched from the back surface side until the electrode is exposed. The mask is removed, the semiconductor substrate is cleaned, and the metal film is thereafter formed on the back surface, a side wall of the via hole and the lower surface of the electrode. Because the back surface of the electrode is exposed in the via hole, the electrode on the front surface side and the metal film on the back surface side contact each other.

With the increase in the degree of integration of semiconductor devices, the sizes of via holes in planar directions have been reduced. There is, therefore, a need to further improve the anisotropy of dry etching so that via holes are not expanded in horizontal directions when the via holes are formed. For this reason, a film formed on a via hole side wall in a semiconductor device at the time of etching is made stronger in order to avoid etching in lateral directions. A residue which cannot be completely removed by removal/cleaning after etching then remains on the via hole side wall. When the semiconductor device is heated after the via hole is formed, a pressure is applied to the interface between the semiconductor substrate and the metal film by a gas generated from a residue covered with the metal film on the back surface side. This pressure is transmitted through the interface to expand the interface between the electrode and the metal film having low adhesion strength. As a result, the connection between the electrode and the metal film is severed and the electrical conduction between the electrode and the metal film is lost.

SUMMARY

In view of the above-described problem, an object of the present invention is to provide a semiconductor device capable of securing electrical conduction between the front surface side and the back surface side of a substrate when the semiconductor device is heated after a via hole is formed.

According to the present invention, a semiconductor device includes: a semiconductor substrate through which a via hole is formed from a back surface to a front surface of the semiconductor substrate; an electrode provided on the front surface of the semiconductor substrate and closing the via hole; and a metal film provided on the back surface of the semiconductor substrate, a side wall of the via hole and a lower surface of the electrode, wherein an opening is provided in the metal film on the back surface of the semiconductor substrate, and the opening abuts on only part of a circumference of the via hole.

In the present invention, a gas generated from a residue permeates the interface between the semiconductor substrate and the metal film and reaches the opening provided in the metal film. The opening abuts on the circumference of the via hole, and the interface between the side wall of the via hole and the metal film is exposed in the opening. Therefore, the gas having permeated the interface is discharged out of the semiconductor device. Severing of the connection between the electrode and the metal film can be prevented thereby, thus securing electrical conduction between the front surface side and the back surface side of the substrate even when the semiconductor device is heated after the via hole is formed. Other and further objects, features and advantages of the invention will appear more fully from the following description.

DESCRIPTION OF EMBODIMENTS

A semiconductor device according to the embodiments of the present invention will be described with reference to the drawings. The same components will be denoted by the same symbols, and the repeated description thereof may be omitted.

First Embodiment

Figure 1:
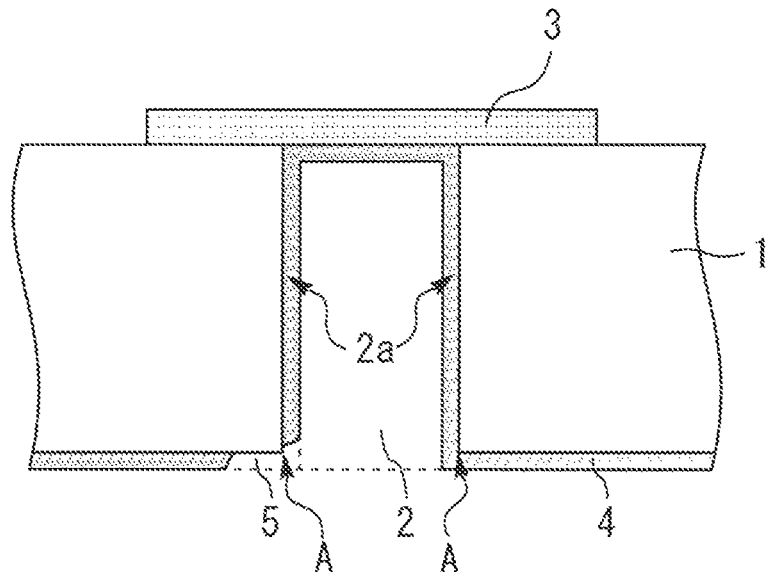
FIG. 1 is a sectional view of a semiconductor device according to a first embodiment of the present invention.
Figure 2:
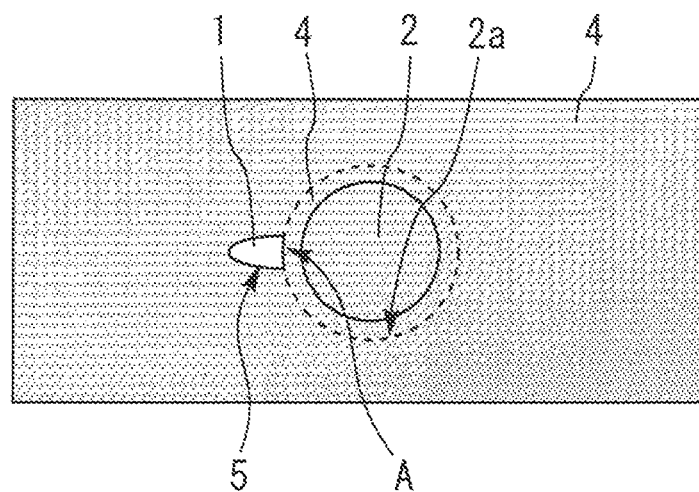
FIG. 2 is a bottom view of the semiconductor device according to the first embodiment of the present invention.

FIG. 1 is a sectional view of a semiconductor device according to a first embodiment of the present invention. FIG. 2 is a bottom view of the semiconductor device according to the first embodiment of the present invention.

A semiconductor device (not shown) is formed on a front surface of a semiconductor substrate 1. A via hole 2 is formed through the semiconductor substrate 1 from a back surface to the front surface of the semiconductor substrate 1. An inner wall of the semiconductor substrate 1 exposed in the via hole 2 is assumed here to be a side wall 2a of the via hole 2. The planar shape of the via hole 2 as viewed in a plan view seen from a direction perpendicular to the back surface of the semiconductor substrate 1 is circular. However, the via hole 2 may alternatively have some other shape, e.g., an elliptical shape.

An electrode 3 is provided on the front surface of the semiconductor substrate 1 so as to close the via hole 2. A metal film 4 is provided on the back surface of the semiconductor substrate 1, the side wall 2a of the via hole 2 and a lower surface of the electrode 3. The metal film 4 and the lower surface of the electrode 3 directly contact each other, thereby providing electrical conduction between the front surface side and the back surface side of the semiconductor substrate 1. The side wall 2a of the via hole 2 and the metal film 4 directly contact each other, thereby forming an interface A. The interface A between the side wall 2a of the via hole 2 and the metal film 4 is provided through the entire circumference of the via hole 2, as viewed in the plan view seen from a direction perpendicular to the back surface of the semiconductor substrate 1.

An opening 5 is provided in the metal film 4 on the back surface of the semiconductor substrate 1. The opening 5 abuts on only part of the circumference of the via hole 2, as viewed in the plan view seen from a direction perpendicular to the back surface of the semiconductor substrate 1. The interface A between the side wall 2a of the via hole 2 and the metal film 4 is exposed in the opening 5. If the opening 5 abuts on the entire circumference of the via hole 2, the metal film 4 on the back surface of the semiconductor substrate 1 and the metal film 4 on the side wall 2a of the via hole 2 are separate from each other and no electrical conduction is provided between the front surface side and the back surface side of the semiconductor substrate 1.

A method of manufacturing the semiconductor device according to the present embodiment will subsequently be described. First, the electrode 3 is formed on the front surface of the semiconductor substrate 1. The semiconductor substrate 1 is ground at the back surface side until the semiconductor substrate 1 has a predetermined thickness. Subsequently, the back surface of the semiconductor substrate 1 except the place for formation of the via hole 2 is masked with a resist or the like and the semiconductor substrate 1 is etched from the back surface side until the electrode 3 is exposed. The mask is removed, the semiconductor substrate 1 is cleaned, and the metal film 4 is thereafter formed on the entire surface on the back surface side of the semiconductor substrate 1, i.e., the substrate back surface, the side wall 2a of the via hole 2 and the lower surface of the electrode 3. Subsequently, to enable removal of the metal film 4 on dicing lines, the back surface except the place for formation of the opening 5 and the dicing lines is covered with a photoresist. The metal film 4 is processed in this state with a solution which etches the metal film 4 but does not etch the semiconductor substrate 1, thereby forming the opening 5.

Figure 3:
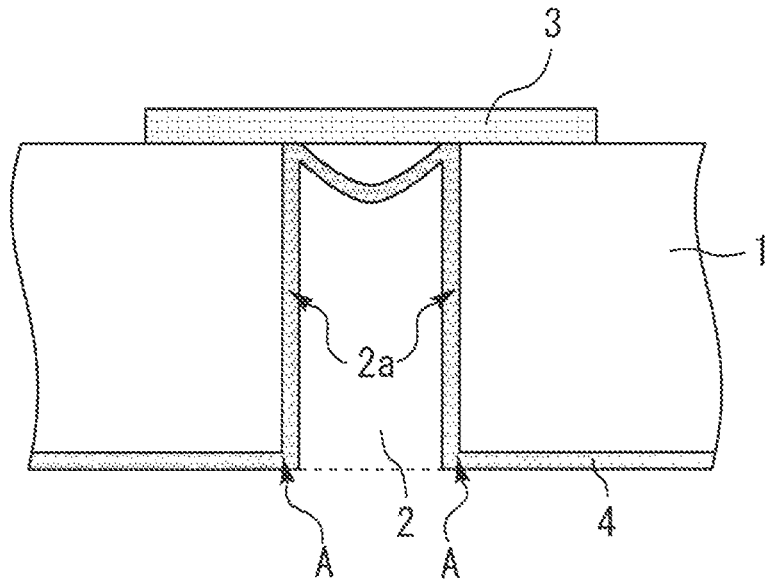
FIGS. 3 and 4 are sectional views showing a semiconductor device according to the comparative example.
Figure 4:
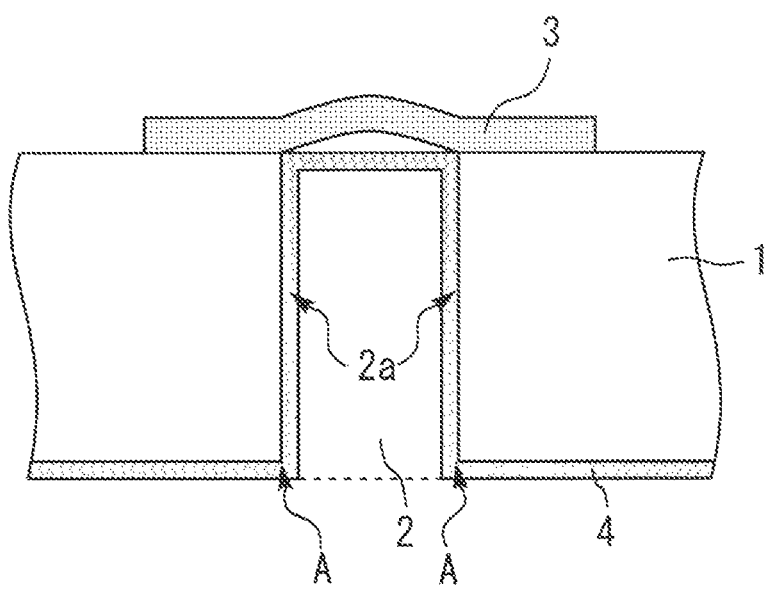

The advantage of the present embodiment will subsequently be described through comparison with a comparative example. FIGS. 3 and 4 are sectional views showing a semiconductor device according to the comparative example. In the comparative example, the opening 5 is not provided in the metal film 4. When the semiconductor device is heated after the via hole 2 is formed, a pressure is applied to the interface A between the semiconductor substrate 1 and the metal film 4 by a gas generated from a residue covered with the metal film 4 on the back surface side. This pressure is transmitted through the interface A to expand the interface A between the electrode 3 on the front surface side and the metal film 4 on the back surface side having low adhesion strength. As a result, the connection between the electrode 3 and the metal film 4 is severed and the electrical conduction between the electrode 3 and the metal film 4 is lost.

In the present embodiment, a gas generated from a residue permeates the interface A between the semiconductor substrate 1 and the metal film 4 and reaches the opening 5 provided in the metal film 4. The opening 5 abuts on the circumference of the via hole 2, and the interface A between the side wall 2a of the via hole 2 and the metal film 4 is exposed in the opening 5. Therefore, the gas having permeated the interface A is discharged out of the semiconductor device. Severing of the connection between the electrode 3 and the metal film 4 can be prevented thereby, thus securing electrical conduction between the front surface side and the back surface side of the substrate even when the semiconductor device is heated after the via hole 2 is formed.

Second Embodiment

Figure 5:
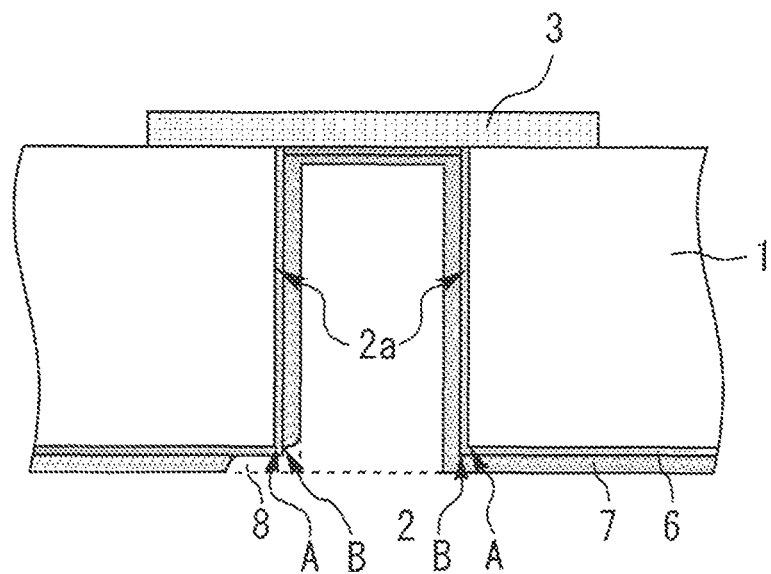
FIG. 5 is a sectional view of a semiconductor device according to a second embodiment of the present invention.
Figure 6:
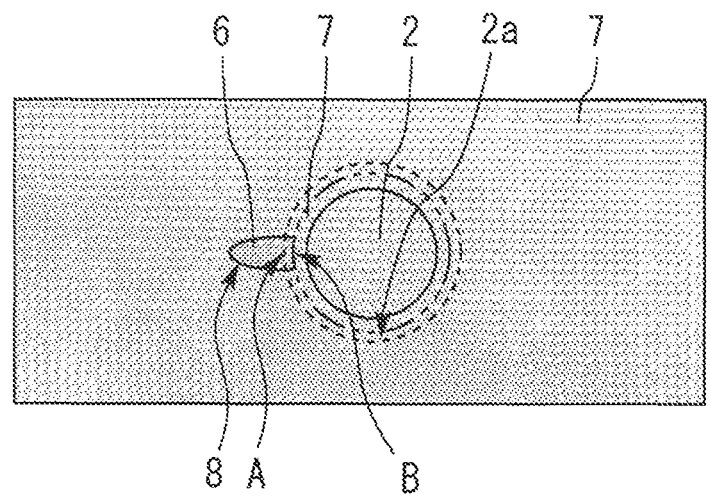
FIG. 6 is a bottom view of the semiconductor device according to the second embodiment of the present invention.

FIG. 5 is a sectional view of a semiconductor device according to a second embodiment of the present invention. FIG. 6 is a bottom view of the semiconductor device according to the second embodiment of the present invention. In the present embodiment, first and second metal films 6 and 7 are successively laid on the back surface of the semiconductor substrate 1, the side wall 2a of the via hole 2 and the lower surface of the electrode 3 in place of the metal film 4 in the first embodiment. The first metal film 6 is thinner than the second metal film 7. The second metal film 7 is a main layer for conductivity in the metal films on the back surface side, and the thickness of the second metal film 7 occupies the great part of the thickness of metal film on the back surface side. The first metal film 6 is formed by electroless plating as a feeder layer in a case where the second metal film 7 is formed by electroplating. However, forming of the first metal film 6 is not limited to this. The first metal film 6 may be formed as a barrier layer for securing an adhesion force. Forming methods other than those described above, for example, sputtering are also applicable.

An opening 8 is provided in the second metal film 7 on the back surface of the semiconductor substrate 1. The opening 8 abuts on only part of the circumference of the via hole 2. The opening 8 in the present embodiment is formed in the same way as in the first embodiment. That is, the metal film 7 is etched while the back surface except the place for formation of the opening 8 and dicing lines is covered with a photoresist.

An interface B between the first metal film 6 on the side wall 2a of the via hole 2 and the second metal film 7 is exposed in the opening 8. The interface A between the side wall 2a of the via hole 2 and the first metal film 6 is also formed at positions substantially the same as the positions at which the interface B is formed. A portion of the interface A exists under the first metal film 6 remaining in the opening 8.

In the present embodiment, a gas generated from a residue permeates the interface A between the semiconductor substrate 1 and the first metal film 6 and reaches the opening 8 provided in the second metal film 7. An inner portion of the opening 8 is closed with the first metal film 6. However, since the first metal film 6 is thin, the gas passes through the first metal film 6 to be discharged out of the semiconductor device. As a result, electrical conduction can be secured between the front surface side and the back surface side of the substrate even when the semiconductor device is heated after the via hole 2 is formed.

Since the thin first metal film 6 is left, there is no need to perform etching two times on the major second metal film 7 and the thin first metal film 6, thus simplifying the process. Further, in a case where the metal film is formed by electroless plating, the influence of a gas is considerable because a heat treatment after the electroless plating is required. Therefore, the advantage of the provision of the opening 8 in the second metal film 7 as in the present embodiment is high.

Third Embodiment

Figure 7:
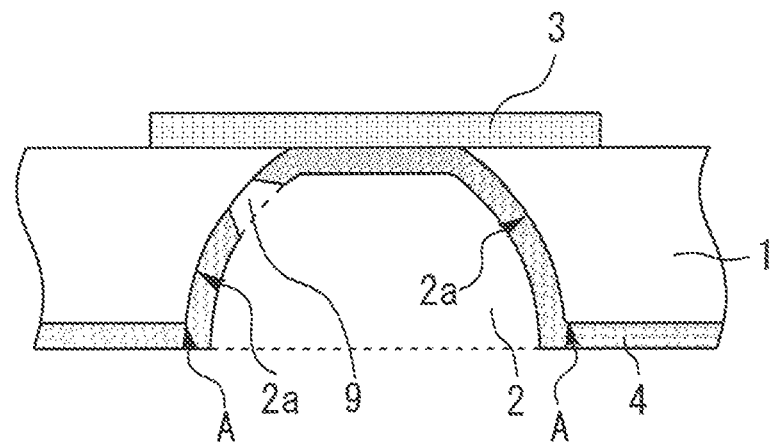
FIGS. 7 and 8 are sectional views of a semiconductor device according to a third embodiment of the present invention.
Figure 8:
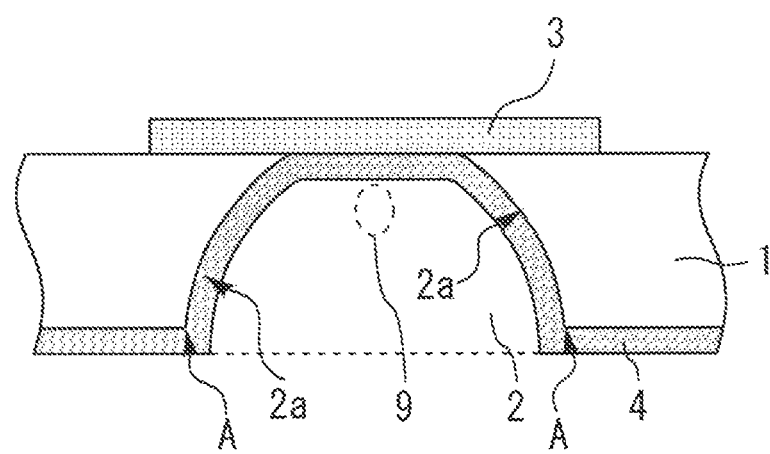

FIGS. 7 and 8 are sectional views of a semiconductor device according to a third embodiment of the present invention. In FIG. 8, the semiconductor device is seen in a direction different from the direction in which the semiconductor device is seen in FIG. 7. An opening 9 is provided in the metal film 4 on the side wall 2a of the via hole 2 in place of the opening 5 in the first embodiment. The side wall 2a of the via hole 2 is exposed in the opening 9.

In the present embodiment, the side wall 2a of the via hole 2 is formed into a tapered shape such that the side wall 2a can be formed by photoengraving. The metal film 4 is formed on the entire surface on the back surface side of the semiconductor substrate 1, and the back surface except the place for formation of the opening 9 is thereafter covered with a photoresist. The metal film 4 is processed in this state with a solution which etches the metal film 4 but does not etch the semiconductor substrate 1, thereby forming the opening 9.

A gas generated from a residue permeates the interface A to be discharged out of the semiconductor device through the opening 9, as in the first embodiment. As a result, electrical conduction can be secured between the front surface side and the back surface side of the substrate even when the semiconductor device is heated after the via hole 2 is formed. Although the method of forming the opening 9 is complicated, the provision of the opening 9 in the via hole 2 facilitates escapement of the gas in comparison with the first embodiment.

Fourth Embodiment

Figure 9:
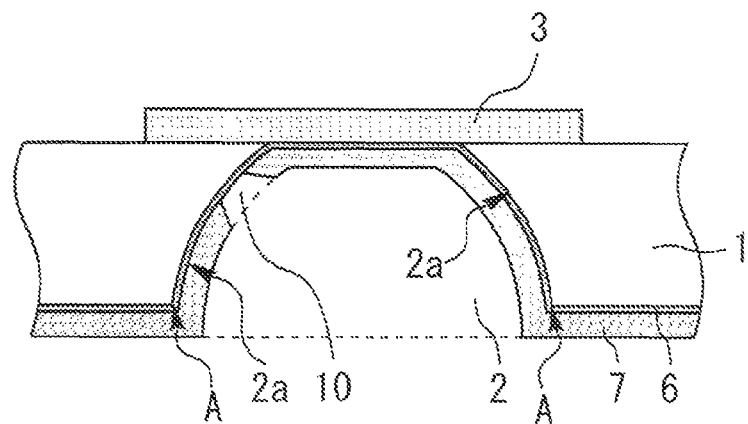
FIG. 9 is a sectional view of a semiconductor device according to a fourth embodiment of the present invention.

FIG. 9 is a sectional view of a semiconductor device according to a fourth embodiment of the present invention. In the present embodiment, first and second metal films 6 and 7 are successively laid on the back surface of the semiconductor substrate 1, the side wall 2a of the via hole 2 and the lower surface of the electrode 3 in place of the metal film 4 in the third embodiment. The first metal film 6 is thinner than the second metal film 7. An opening 10 is provided in the second metal film 7 on the side wall 2a of the via hole 2. The first metal film 6 is exposed in the opening 10. With this arrangement, the same advantages as those in the second and third embodiments can be obtained.

Fifth Embodiment

Figure 10:
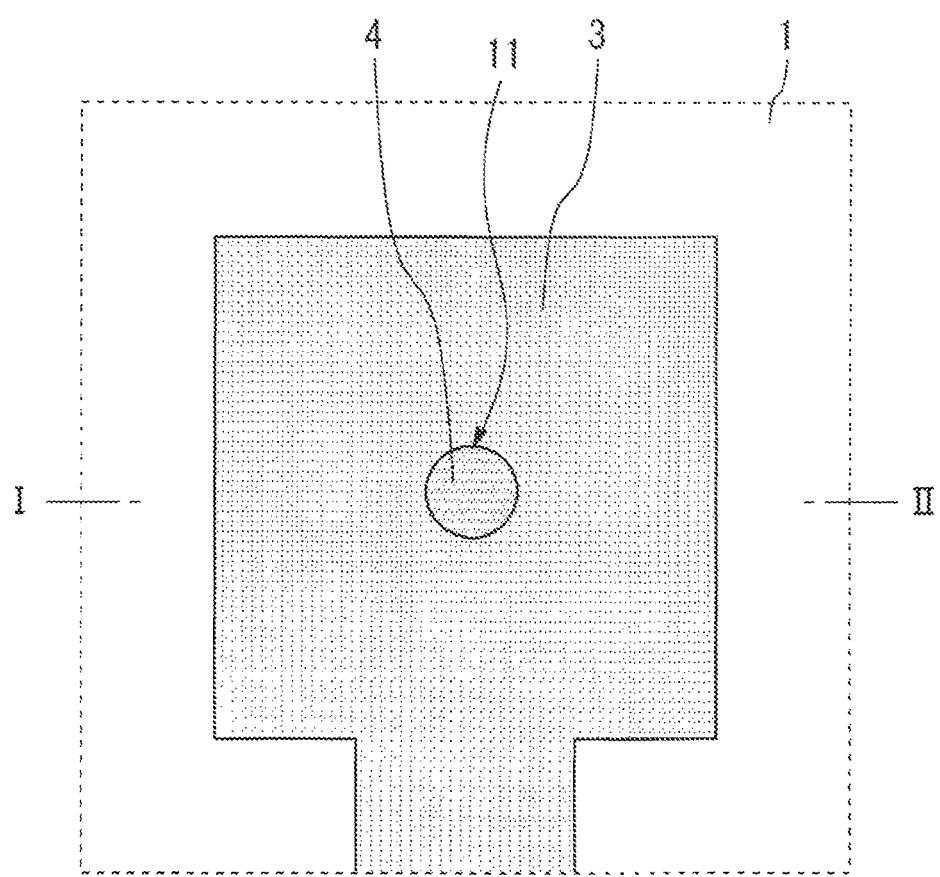
FIG. 10 is a plan view of a semiconductor device according to a fifth embodiment of the present invention.
Figure 11:
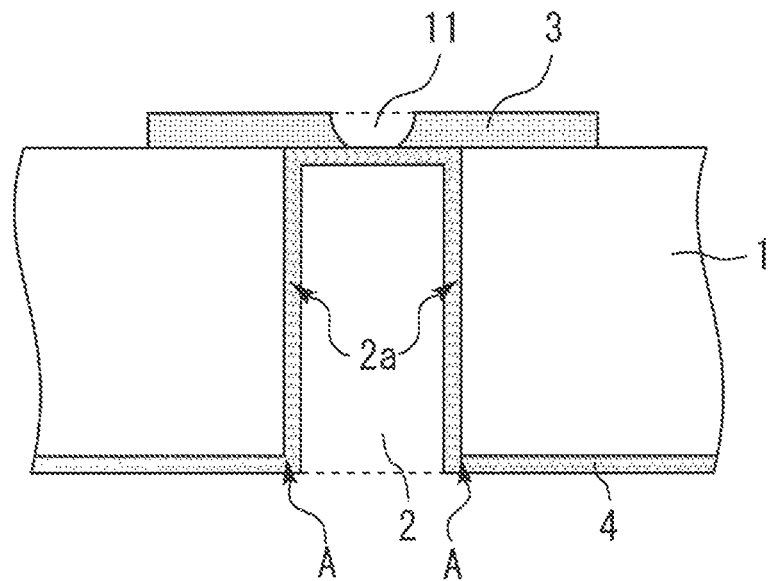
FIG. 11 is a sectional view taken along line I-II in FIG. 10.

FIG. 10 is a plan view of a semiconductor device according to a fifth embodiment of the present invention. FIG. 11 is a sectional view taken along line I-II in FIG. 10. An opening 11 is provided in the electrode 3 on the via hole 2 in place of the opening 5 in the first embodiment. The metal film 4 is exposed in the opening 11.

In the present embodiment, the front surface of the substrate except the place for formation of the opening 11 is covered with a photoresist after the via hole 2 and the metal film 4 are formed, and the electrode 3 on the front surface side is etched, with the metal film 4 on the back surface side used as a stopper layer, thereby forming the opening 11.

A gas generated from a residue permeates the interface A to be discharged out of the semiconductor device through the opening 11, as in the first embodiment. As a result, electrical conduction can be secured between the front surface side and the back surface side of the substrate even when the semiconductor device is heated after the via hole 2 is formed. Although the method of forming the opening 11 is complicated, the provision of the opening 11 on the via hole 2 facilitates escapement of the gas in comparison with the first embodiment.

Sixth Embodiment

Figure 12:
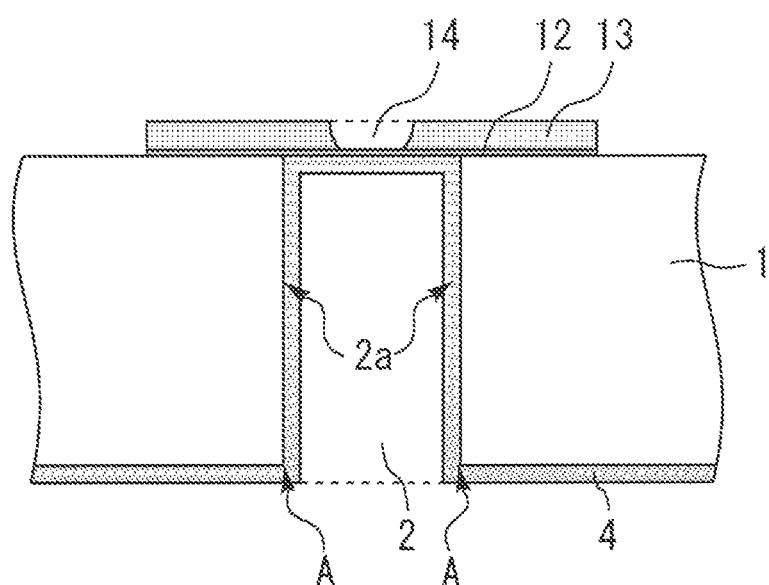
FIG. 12 is a sectional view of a semiconductor device according to a sixth embodiment of the present invention.

FIG. 12 is a sectional view of a semiconductor device according to a sixth embodiment of the present invention. First and second electrodes 12 and 13 are successively laid on the front surface of the semiconductor substrate 1 so as to close the via hole 2 in place of the electrode 3 in the fifth embodiment. The first electrode 12 is thinner than the second electrode 13. An opening 14 is provided in the second electrode 13 on the via hole 2. The first electrode 12 is exposed in the opening 14. With this arrangement, the same advantages as those in the second and fifth embodiments can be obtained.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2016-021641, filed on Feb. 8, 2016 including specification, claims, drawings and summary, on which the Convention priority of the present application is based, is incorporated herein by reference in its entirety.

The invention claimed is:

1. A semiconductor device comprising:
   a semiconductor substrate through which a via hole is formed from a back surface to a front surface of the semiconductor substrate;
   an electrode provided on the front surface of the semiconductor substrate and closing the via hole; and
   a metal film provided on the back surface of the semiconductor substrate, a side wall of the via hole, and a lower surface of the electrode,
   wherein an opening is provided in the metal film on the back surface of the semiconductor substrate, and
   the opening abuts on only part of a circumference of the via hole to thereby discharge gas permeating an interface between the semiconductor substrate and the metal film.

2. The semiconductor device according to claim 1, wherein the interface between the side wall of the via hole and the metal film is exposed in the opening.

3. The semiconductor device according to claim 1, wherein the metal film includes first and second metal films successively laid on the back surface of the semiconductor substrate, a side wall of the via hole and a lower surface of the electrode,
   the first metal film is thinner than the second metal film,
   the opening is provided in the second metal film on the back surface of the semiconductor substrate, and
   an interface between the first and second metal films on the side wall of the via hole is exposed in the opening.

* * * * *